(12) United States Patent
Zuo et al.

(10) Patent No.: US 6,858,929 B2
(45) Date of Patent: Feb. 22, 2005

(54) SEMICONDUCTOR PACKAGE WITH LID HEAT SPREADER

(75) Inventors: Jon Zuo, Lancaster, PA (US); Donald M. Ernst, Lancaster, PA (US)

(73) Assignee: Thermal Corp., Stanton, DE (US)

( * ) Notice: Subject to any disclaimer, the term of this patent is extended or adjusted under 35 U.S.C. 154(b) by 51 days.

(21) Appl. No.: 10/241,947

(22) Filed: Sep. 12, 2002

(65) Prior Publication Data

US 2003/0015789 A1 Jan. 23, 2003

Related U.S. Application Data

(62) Division of application No. 09/774,475, filed on Jan. 30, 2001, now Pat. No. 6,525,420.

(51) Int. Cl.[7] .......................... H01L 23/12; H01L 23/06; H01L 23/15; H01L 23/34
(52) U.S. Cl. ........................ 257/704; 257/715; 257/705; 257/706; 257/712; 257/713; 257/714; 257/720; 257/721
(58) Field of Search ................................. 257/704, 715, 257/705, 712, 713, 714, 721, 706, 720

(56) References Cited

U.S. PATENT DOCUMENTS

| | | |
|---|---|---|
| 3,739,235 A | 6/1973 | Kessler, Jr. |
| 3,792,318 A | 2/1974 | Fries et al. |
| 3,984,861 A | 10/1976 | Kessler, Jr. |
| 4,327,399 A | 4/1982 | Sasaki et al. |
| 4,374,457 A | 2/1983 | Wiech, Jr. |
| 4,519,447 A | 5/1985 | Wiech, Jr. |
| 4,531,145 A | 7/1985 | Wiech, Jr. |
| 4,697,205 A | 9/1987 | Eastman |
| 5,933,323 A * | 8/1999 | Bhatia et al. ................ 361/700 |
| 6,133,631 A * | 10/2000 | Belady ........................ 257/714 |
| 6,525,420 B2 * | 2/2003 | Zuo et al. .................... 257/715 |

* cited by examiner

Primary Examiner—Nitin Parekh
(74) Attorney, Agent, or Firm—Duane Morris LLP

(57) ABSTRACT

The invention provides a semiconductor package having a substrate, a top surface and at least one semiconductor device attached to the top surface of the substrate. A cover is secured to the substrate creating a space between the cover and the substrate, with the semiconductor device residing within the space. The cover includes an inner chamber that is defined by an upper wall and a lower wall of the cover. The cavity contains a two-phase vaporizable liquid and a wick. Advantageously, the wick on the lower wall includes at least one recess that forms a thinned wall adjacent to a high heat generation portion of the semiconductor device. In one embodiment, the wick on the lower wall includes at least one channel that communicates with at least one of the recesses.

21 Claims, 6 Drawing Sheets

SEMICONDUCTOR PACKAGE WITH LID HEAT SPREADER

This application is a divisional application of U.S. Application Ser. No. 09/774,475, filed on Jan. 30, 2001 now U.S. Pat. No. 6,525,420

FIELD OF THE INVENTION

The present invention generally relates to thermal management in semiconductor devices, and more particularly to a package architecture that is adapted for use with semiconductor devices to spread heat generated at hot spots.

BACKGROUND OF THE INVENTION

The performance of electronic circuits and their semiconductor devices ("chips") is limited by temperature. Semiconductor device performance degrades when the internal temperature reaches or exceeds a particular limit. For example, in silicon integrated circuit devices, for each ten degree centigrade rise in junction temperature, the operating lifetime of the semiconductor device is decreased by a factor of at least two. Demands by OEMs for smaller package sizes and increased device densities has resulted in higher power densities, with the concomitant need for efficient heat dissipation becoming extremely important.

This industry need is compounded, in next generation, highly integrated semiconductor devices by the occurrence of "hot spots", i.e., localized areas on the chip having relatively high thermal energy generation. These hot spots arise at locations on the chip where significant electrical activity occurs, e.g., processor, I/O control circuits, etc. The manner of cooling these devices has depended upon many parameters, including the space available for the cooling process, the temperatures to be encountered, the location(s) of hot spots, and the ability to distribute or "spread" the thermal energy over sufficient surface area to provide for efficient heat transfer. In the past, simply passing a fluid over the device or, over a finned heat sink that is attached to the device, was sufficient to maintain the semiconductor at safe operating temperatures. Different cooling fluids have been used, depending upon the application and the density of the electronic devices in a given circuit. Boiling liquids are often used, such as fluorinated hydrocarbon refrigerants, which are delivered to the semiconductor device in liquid form, and are then boiled to remove heat. These systems often have the highest heat removal rate for a limited area, but require a considerable amount of power to operate, i.e. to be pumped to and from the heat transfer site.

It is also well known in the art to employ heat pipes to cool semiconductor devices and packages. For example, in U.S. Pat. No. 4,697,205, issued to Eastman, a semiconductor circuit construction is provided in which the semiconductor junction is constructed as an integral part of a heat pipe to eliminate the package casing which tends to interfere with heat flow. The semiconductor chip material directly forms one wall of the casing of a heat pipe which is constructed as a hollow wafer-like configuration.

In U.S. Pat. No. 4,912,548, issued to Shanker et al., a housing is provided with a heat pipe that passes through the lid. The heat pipe terminates within the housing cavity at a hot end. A quantity of working fluid, such as fluorinated octane, is contained within the package cavity. The heat pipe communicates with cooling fins that produce a cold end. Heat from the semiconductor device inside the housing boils the working fluid. The fluid vapor passes along the heat pipe and is condensed at the cold end to be converted back to liquid.

In U.S. Pat. No. 5,097,387, issued to Griffith, a circuit chip package is disclosed which employs low eutectic or melting point solder as a thermally conductive medium between each circuit chip and the package cover. The package cover consists of a heat exchanger which includes a conventional heat pipe structure including a heat transfer fluid filled chamber, and a plurality of apertured pipes through which is passed another cooling fluid, such as air, to remove heat from the heat transfer fluid.

In U.S. Pat. No. 5,708,297, issued to Clayton, a multichip semiconductor module The is disclosed that is compatible with SIMM memory sockets. The multichip module includes a molded module frame and a composite semiconductor substrate subassembly received in a cavity in the frame. A cover plate and frame, alone or in combination, contain multiple compartments or channels through which gas or liquid coolant materials can be circulated to effectively distribute or remove heat generated from the semiconductor devices. In one embodiment, the cover plate includes a thin heat pipe.

In U.S. Pat. No. 5,780,928, issued to Rostoker et al., an electronic system is disclosed that provides thermal transfer from a semiconductor die in a semiconductor package by at least partially filling a cavity in the package with a thermally conductive fluid, immersing a heat collecting portion of a heat pipe assembly into the fluid, and sealing the cavity. In order that the thermally conductive fluid does not chemically attack the die or its electrical connections, the die and connections are completely covered with an encapsulating coating of an inorganic dielectric material by any of a variety of techniques. The heat pipe provides heat transfer from within the package to an external heat sink. In one embodiment, an absorptive wick is disposed within the package to transport condensed coolant to close proximity with the die.

In U.S. Pat. No. 5,880,524, issued to Xie, a package is provided for spreading the heat generated by a semiconductor device. The semiconductor device, such as a CPU, is mounted to a package substrate, a cover is attached to the package substrate creating a space therebetween for accommodating the semiconductor device. The package cover includes an external top surface and an external bottom surface and an inner cavity that comprises a heat pipe. The semiconductor device is thermally coupled to the bottom external surface of the cover.

These and other prior art devices use heat pipes to transfer thermal energy away from the semiconductor device and its package, but do not provide an efficient heat spreading mechanism for distributing the thermal energy generated by hot spots on the chip across the package itself. There is a need for a semiconductor packaging structure that efficiently and evenly spreads thermal energy generated by hot spots on a chip across a substantial portion of the package so that the thermal energy may be removed rapidly and effectively from the package.

SUMMARY OF THE INVENTION

The present invention provides a semiconductor package comprising a substrate having a top surface and at least one semiconductor device attached to the top surface of the substrate. A cover is secured to the substrate creating a space between the cover and the substrate, with the semiconductor device residing within the space. The cover includes an inner chamber that is defined by a first wall and a second wall of the cover. The inner chamber contains a two-phase vaporizable liquid and a wick. Advantageously, the wick on the second wall includes at least one recess that forms a thinned wall adjacent to a high heat generation portion of the semiconductor device. In one embodiment of the invention, the wick on the second wall includes at least one channel that communicates with at least one recess. In another embodiment of the invention the second wall includes a recessed portion corresponding to the recessed portion of the wick.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
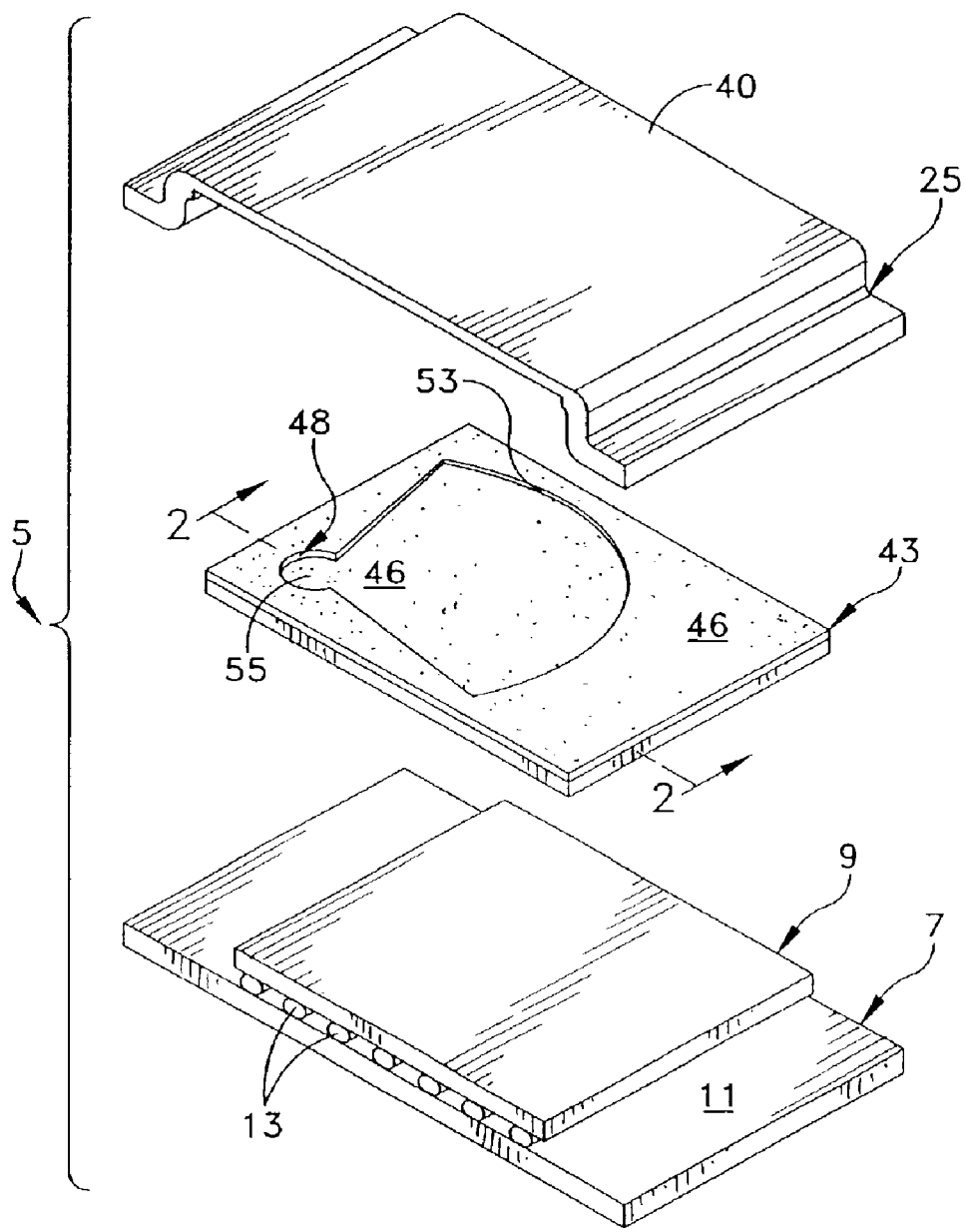
FIG. 1 is an exploded perspective view of a semiconductor package lid heat spreader formed in accordance with one embodiment of the present invention.
Figure 2:
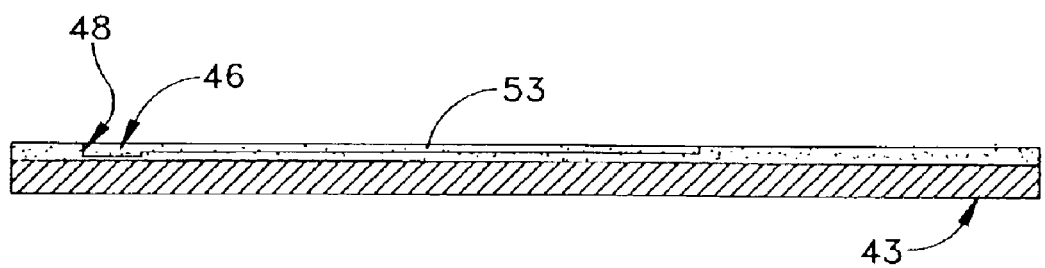
FIG. 2 is a cross-sectional view of a bottom wall of the semiconductor package lid heat spreader shown in FIG. 1, as taken along line 2—2 in FIG. 1.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Referring to FIG. 1, a semiconductor package heat spreader 5 formed in accordance with the present invention includes a substrate 7 having a semiconductor device 9 mounted on the top surface 11 of substrate 7. Semiconductor device 9 is often mechanically and electrically coupled to the top surface 11 of substrate 7, via a plurality of solder bump connections 13. Substrate 7 may contain one or more wiring layers (not shown) that electrically interconnect semiconductor device 9 to pins or the like (not shown) located along a bottom surface 15 of substrate 7.

Figure 3:
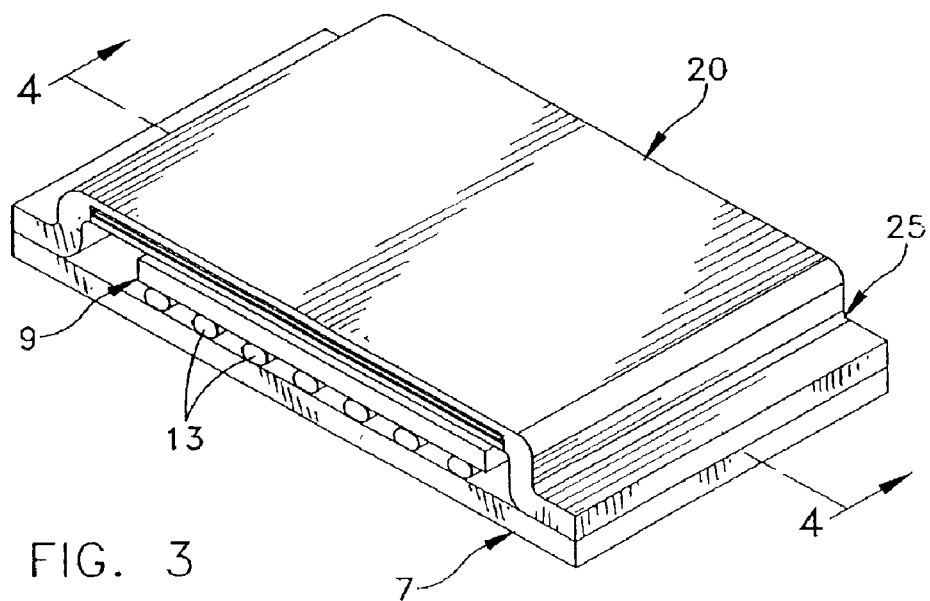
FIG. 3 is a perspective view of the semiconductor package lid heat spreader shown in FIG. 1, but with an edge open for clarity of illustration.
Figure 4:
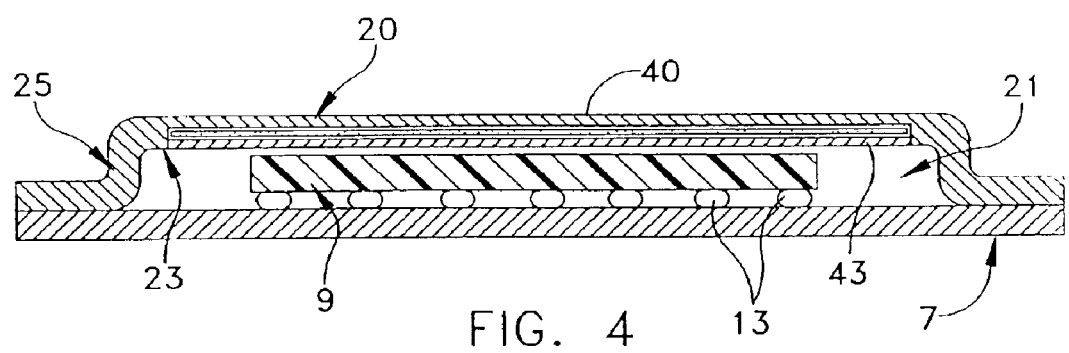
FIG. 4 is a cross-sectional view of the semiconductor package lid heat spreader shown in FIG. 3, as taken along line 4—4 in FIG. 3.
Figure 5:
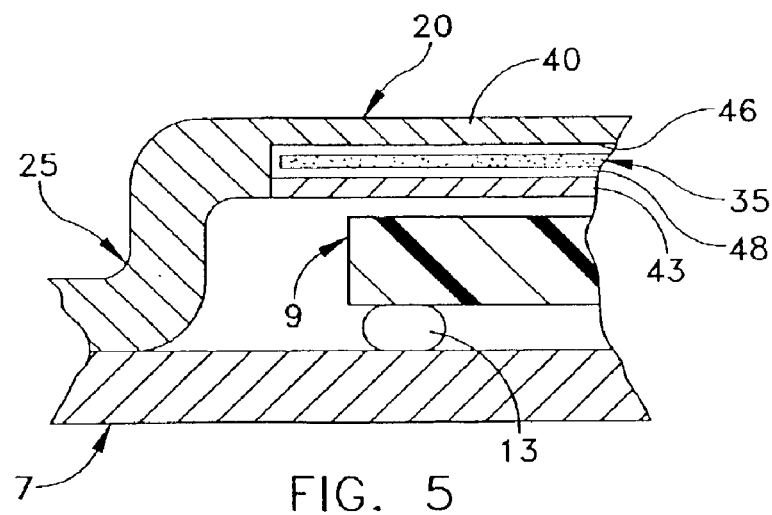
FIG. 5 is an enlarged and broken-away cross-sectional view of a corner portion of the semiconductor package lid heat spreader shown in FIG. 4.

Referring to FIGS. 3–5, a cover/lid 20 is attached to substrate 7 and forms a void space or gap 21 between the interior surface 23 of cover/lid 20 and top surface 11 of substrate 7. Mounting flanges 25 are formed along the peripheral edges of cover/lid 20 so that substrate 7 may be hermetically fastened to cover/lid 20. Mounting flanges 25 serve to support cover/lid 20 above substrate 7 and semiconductor device 9. The height of mounting flanges 25 is selected such that gap 21 is sized to accept semiconductor device 9. A heat transfer medium of the type well known in the art may be positioned between the top surface of semiconductor device 9 and cover/lid 20 to thermally couple them together. The heat transfer medium may comprise a thermal grease, such as a silver filled epoxy or the like. The thickness of the heat transfer medium will vary depending upon the performance requirements of semiconductor device 9. Generally, the thickness of the heat transfer medium varies between about 0.2 millimeters (mm) to about 0.8 millimeters (mm).

Referring to FIGS. 1–5, cover/lid 20 includes a vapor chamber 35 that is defined between an outer or top wall 40 and an inner or bottom wall 43, and extends transversely and longitudinally throughout cover/lid 20. In a preferred embodiment, top wall 40 and bottom wall 43 comprise substantially uniform thickness sheets of a thermally conductive material, and are spaced-apart by about 0.2 (mm) to about 0.3 (mm) so as to form a void space or vapor chamber 35 between them. A two-phase vaporizable liquid (not shown) resides within vapor chamber 35, and serves as the working fluid for the heat spreader. Cover/lid 20 (including top wall 40 and bottom wall 43) is made of copper-silicon-carbide (CuSiC) or aluminum-silicon-carbide (AlSiC), with freon generally chosen as the two-phase vaporizable liquid since it is chemically compatible with aluminum-silicon-carbide (AlSiC) at elevated temperatures, and may possess a relatively high latent heat. Vapor chamber 35 is created by the attachment of top wall 40 and bottom wall 43, along their common edges, which are then hermetically sealed at their joining interface.

Top wall 40 comprises a substantially planer inner wicking surface 46 with an integrally formed wicking layer of aluminum-silicon-carbide (AlSiC) or copper-silicon-carbide (CuSiC) having an average thickness of about 0.1 mm to 1.0 mm. Bottom wall 43 of cover/lid 20 comprises an inner wicking surface 46 with an integrally formed wicking layer of aluminum-silicon-carbide (AlSiC) or copper-silicon-carbide (CuSiC) that is positioned over substantially all of bottom wall 43, and which includes one or more discrete recesses 48. Optionally, one or more recessed channels or troughs 53 may be formed in inner wicking surface 46.

More particularly, recesses 48 comprise a depression in inner wicking surface 46 that forms a thinned wall 55 of wicking material at the bottom of recess 48. In one preferred embodiment, thinned wall 55 may have a thickness of about 0.01 mm to about 0.06 mm. Recess 48 may include any cross-sectional profile, such as rectilinear, polygonal, or curved, with thinned wall 55 having substantially the same cross-sectional shape Advantageously, thinned wall 55 comprises a relatively low thermal resistance as compared to the remainder of inner wicking surface 46. Thinned wall 55 is sized and located in inner wicking surface 46 and on bottom wall 43 so as to correspond with, and be positioned adjacent to localized areas on semiconductor device 9 having relatively high thermal energy generation, i.e., adjacent to so called "hot spots" on the chip. These hot spots often arise at locations on semiconductor device 9 where significant electrical activity occurs, e.g., processor, I/O control circuits, etc. The thinned structure of inner wicking surface 46 at the bottom of recess 48 causes the two-phase vaporizable liquid that pools within recess 48 to quickly evaporate so as to enhance thermal transfer communication between the hot spot on semiconductor 9, inner wicking surface 46 and top wall 40 of cover/lid 20.

Figure 9:
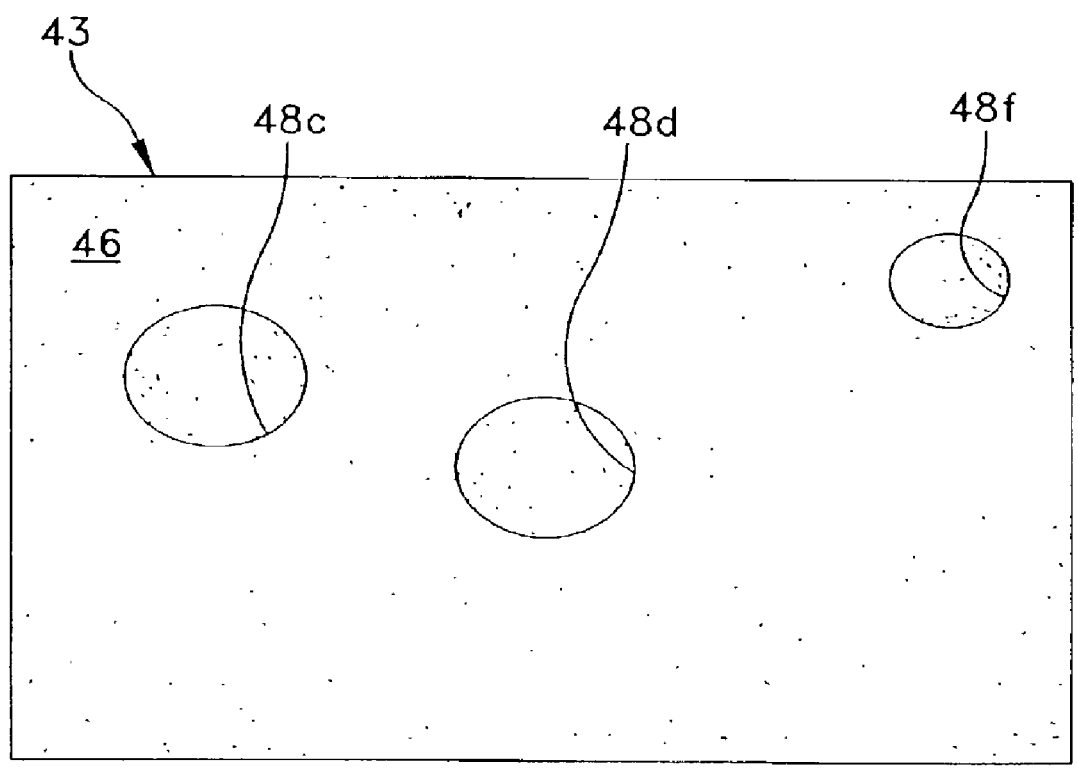
FIG. 9 is a plan view of another exemplary embodiment of a bottom wall of the semiconductor package lid heat spreader having more than one recess.
Figure 10:
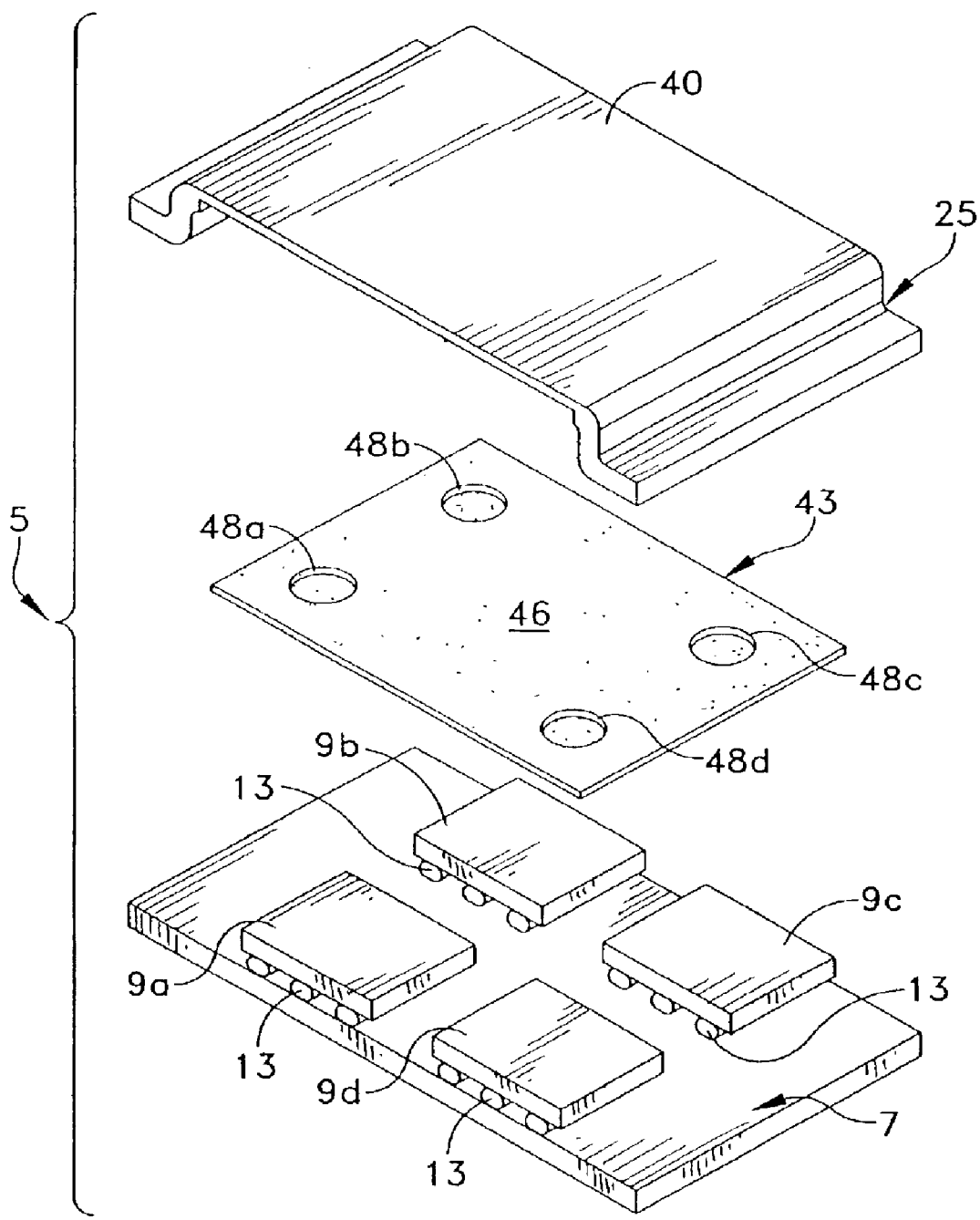
FIG. 10 is an exploded perspective view of a semiconductor package lid heat spreader formed in accordance with a further embodiment of the present invention adapted to spread heat from a plurality of semiconductors.
Figure 11:
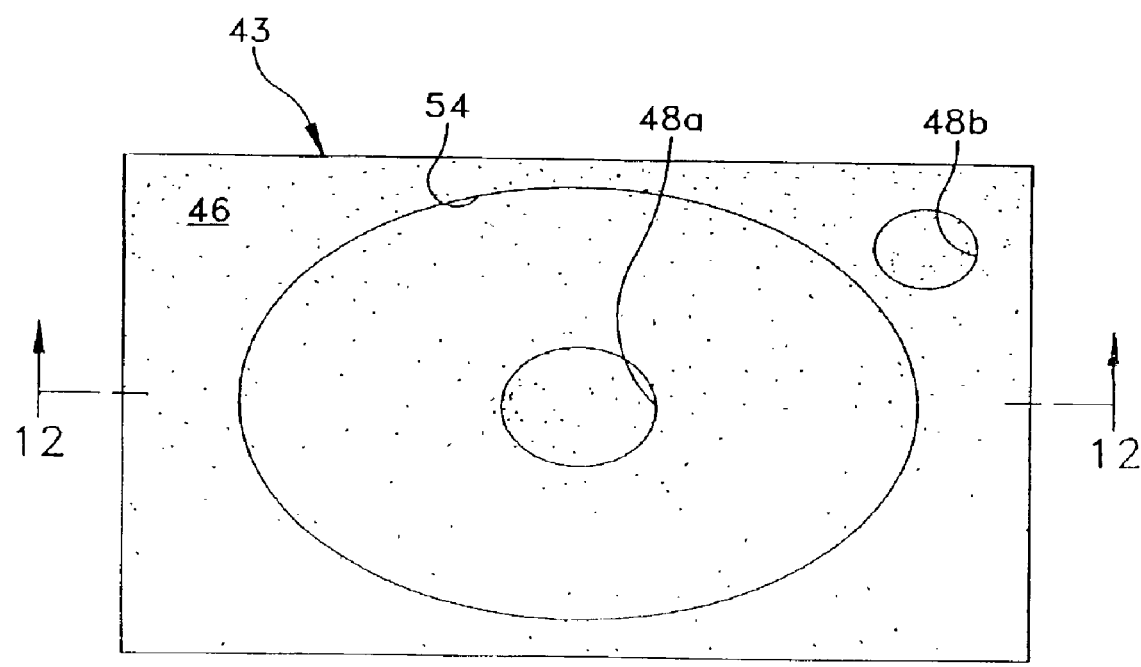
FIG. 11 is a plan view of another exemplary embodiment of a bottom wall of the semiconductor package lid heat spreader having more than one recess.

In this way, the main evaporator region of cover/lid 20 (i.e., recess 48 and thinned wall 55) is advantageously located adjacent to the hot-spots on semiconductor device 9, whereas the condenser region of cover/lid 20 (i.e., the remainder of inner wicking surface 46 or channel 53) is located adjacent relatively lower temperature regions of semiconductor 9. In the evaporator region of thinned wall 55, the working fluid is constantly, quickly, and completely vaporized by heat input from the hot-spots on semiconductor device 9, while in the condenser region the vapor gives up heat and is condensed to liquid. Inner wicking surfaces 46 transport the condensed liquid back to the evaporator region, i.e., recess 48 and thinned wall 55 of inner wicking surface 46 by means of capillary flow. This arrangement effectively spreads thermal energy across the entire package so that it may be drawn off and dissipated by known means, e.g., conventional finned heat sinks or heat pipes, attached to the outer surface of top wall 40. It will be understood that one or more recesses 48a,48b,48c,48d,48e,48f (FIGS. 8–10) may be located within inner wicking surface 46 depending upon the number of "hot-spots" anticipated for a given semiconductor device 9. Of course, more than one semiconductor device 9a–d may be resident within semiconductor package heat spreader 5 necessitating the use of several recesses 48a–d in inner wicking surface 46 (FIG. 10).

Figure 6:
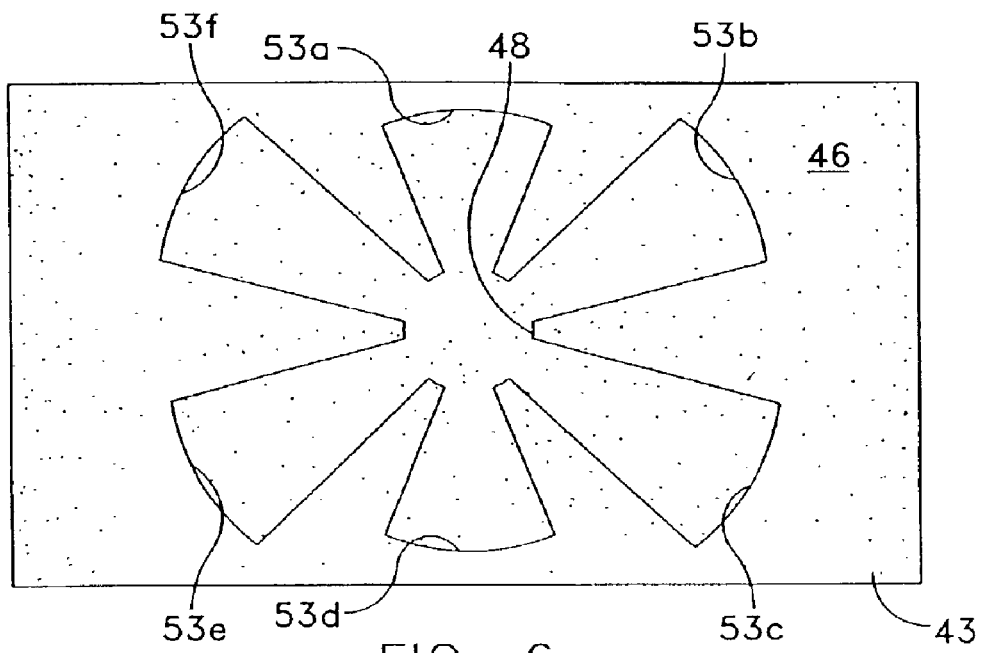
FIG. 6 is a plan view of an alternative, exemplary embodiment of a bottom wall of the semiconductor package lid heat spreader.
Figure 7:
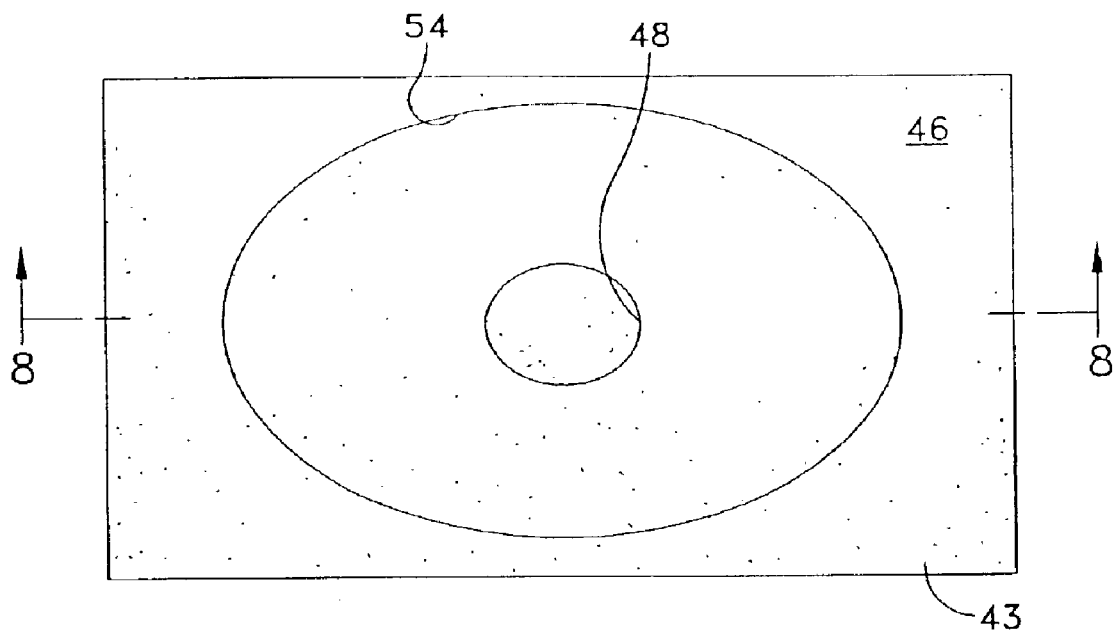
FIG. 7 is a plan view of another alternative, exemplary embodiment of a bottom wall of the semiconductor package lid heat spreader.
Figure 8:
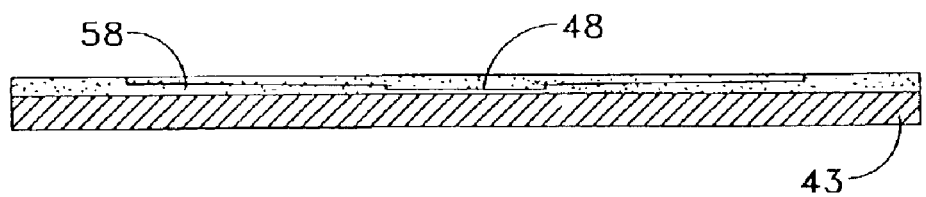
FIG. 8 is a cross-sectional view of the bottom wall of the semiconductor package lid heat spreader shown in FIG. 7, as taken along line 8—8 in FIG. 7.
Figure 12:
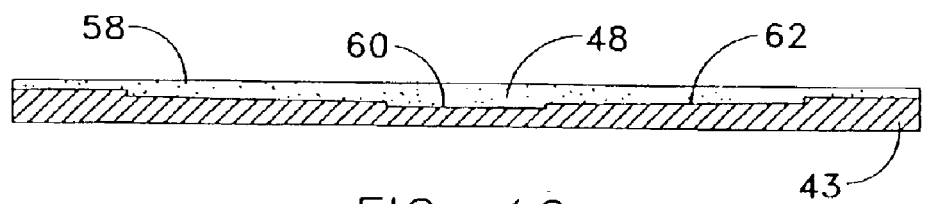
FIG. 12 is a cross-sectional view of the bottom wall of the semiconductor package lid heat spreader shown in FIG. 11, as taken along line 12—12 in FIG. 11 showing a thinning of the bottom wall and wick.

Referring to FIG. 6, one or more recessed channels 53a–f may be formed in inner wicking surface 46. Channels 53a–f have a generally "fan-shaped" cross-sectional profile, i.e., the channels extend radially outwardly from the peripheral edge of recess 48. FIGS. 1 and 7 show alternative embodiments of radially extending channels. Preferably, one end of each channel 53a–f communicates with a recess 48. In a "fan-shaped" channel embodiment, the narrow end of the fan-shape will open into a portion of recess 48, with the remainder of channel 53a–f widening and thickening as it moves away from recess 48. Channels 53a–f may have a constant cross-sectional profile, e.g., rectilinear, curved, polygonal, and extend in a single direction, or may curve or change their direction longitudinally and/or transversely. A channel 58 may also have a variable cross-sectional profile (FIGS. 7 and 8). For example, the depth and or width of the channel's cross-sectional profile may vary, e.g., either narrowing or broadening in a particular direction. Also, bottom wall 43 may include a thinned section 60 adjacent to thinned bottom wall 55 of recesses 48 and thinned sections 62 adjacent to channels 53 (FIG. 12). Here, inner wicking surface 46 also fills thinned sections 60,62 so as to a directed conduit for the two-phase vaporizable liquid.

Cover/lid 20 of the present invention thus provides semiconductor package heat spreader 5 with an enhanced ability to spread the heat generated by semiconductor device 9 at hot-spots on the device to a much larger surface area. As a result of the superior heat transfer and spreading capability of cover/lid 20, a substantially uniform and lower heat flux is produced along top wall 40. The lower heat flux makes it much easier to manage the transfer of heat away from the package. As such, conventional heat sinks or heat pipes may be attached to the top surface of cover/lid 20 to carry heat away from semiconductor device 9. Of course, the internal structure of the cover may vary considerably from one design to another. It is to be understood, however, that the present invention is not limited to any one cover/lid configuration.

It is to be understood that the present invention is by no means limited only to the particular constructions herein disclosed and shown in the drawings, but also comprises any modifications or equivalents within the scope of the claims.

What is claimed is:

1. A semiconductor package comprising:
   a substrate having a top surface;
   at least one semiconductor device attached to said top surface of said substrate;
   a cover secured to said substrate creating a space between said cover and said substrate, said semiconductor device residing within said space, said cover having an inner chamber that is defined by a first wall and a second wall, said inner chamber containing a two-phase vaporizable liquid; and
   a wick positioned within said inner chamber said wick comprising a plurality of channels and recesses, and including at least one recess that forms a thinned wall adjacent to a high heat generation portion of said semiconductor device and at least one channel wherein one end of said at least one channel communicates with said at least one recess.

2. The semiconductor package of claim 1 comprising more than one wick recess.

3. The semiconductor package of claim 2 wherein said at least one channel communicates with one of said at least one recesses.

4. The semiconductor package of claim 2 wherein said at least one channel comprises a variable cross-sectional profile.

5. The semiconductor package of claim 1 wherein said first wall is a top wall of said cover and said second wall is a bottom wall that are spaced-apart so as to form a void space defining said vapor chamber.

6. The semiconductor package of claim 5 wherein said top wall comprises a wicking surface and said bottom wall comprises a wicking surface positioned over substantially all of the interior surfaces of said bottom wall.

7. The semiconductor package of claim 6 wherein said two-phase vaporizable liquid fills said at least one recess so that said two-phase vaporizable liquid quickly evaporates within said at least one recess so as to enhance thermal transfer communication with said semiconductor device.

8. The semiconductor package of claim 6 wherein said vapor chamber comprises a main evaporator region corresponding to said at least one recess and said thinned wall and a condenser region corresponding to at least one channel formed in said wick and located adjacent relatively lower temperature regions of said semiconductor device.

9. The semiconductor package of claim 8 wherein said evaporator region vaporizes working fluid by thermal energy input from said semiconductor device, while said condenser region spreads said thermal energy.

10. The semiconductor package of claim 8 comprising at least one recessed channel extending between said main evaporator region and said condenser region.

11. The semiconductor package of claim 1 wherein said at least one recess comprises a depression formed in said wick so that said thinned wall comprises a relatively low thermal resistance as compared to the remainder of said wick.

12. The semiconductor package of claim 1 wherein said thinned wall is sized and located in said second wall so as to correspond with, and be positioned adjacent to at least one localized area on said semiconductor device having relatively high thermal energy generation.

13. The semiconductor package of claim 1 comprising a plurality of channels wherein one end of each of said channels communicates with at least one recess.

14. The semiconductor package of claim 1 wherein said at least one channel extends radially outwardly from said at least one recess.

15. The semiconductor package of claim 14 wherein said radially extending channel comprises a narrow end that opens on a peripheral edge of said at least one recess.

16. The semiconductor package of claim 15 wherein said radially extending channel comprises a variable cross-sectional profile.

17. A semiconductor package comprising:
   a substrate having a top surface;
   at least one semiconductor device attached to said top surface of said substrate;
   a cover secured to said substrate creating a space therebetween, said semiconductor device residing within said space, said cover having an inner chamber that is defined by confronting walls each wall having a wick, said inner chamber containing a two-phase vaporizable liquid wherein one of said walls includes a portion of said wick including at least one recess and a thinned wick wall positioned close to a high heat generation portion of said semiconductor device wherein said confronting walls comprise a wicking surface having a plurality of recesses arranged in thermal transfer communication with said semiconductor device.

18. A semiconductor package comprising:
   a substrate having a top surface;
   a plurality of semiconductor devices attached to said top surface of said substrate;
   a cover secured to said substrate creating a space therebetween, said semiconductor devices residing within said space, said cover having an inner chamber that is defined by confronting walls each wall having a wicking surface, said inner chamber containing a two-phase vaporizable liquid wherein said wick includes a plurality of recesses each having a thinned wall positioned close to a high heat generation portion of a correspondingly positioned one of said plurality of semiconductor devices.

19. The semiconductor package of claim 18 wherein said wicking defines each of said recesses so that said two-phase vaporizable liquid is quickly evaporated within said recesses and said recesses are arranged in thermal transfer communication with said correspondingly positioned one of said plurality of semiconductor devices.

20. A semiconductor package comprising:
   a substrate having a top surface;
   a plurality of semiconductor devices attached to said top surface of said substrate;
   a cover secured to said substrate creating a space therebetween, said semiconductor devices residing within said space, said cover having an inner chamber that is defined by confronting walls each wall having a wick, said inner chamber containing a two-phase vaporizable liquid wherein said wick includes a plurality of recesses each having a thinned wall positioned close to a high heat generation portion of each of said semiconductor devices; and
   a plurality of channels wherein one end of each of said channels communicates with one of each of said recesses.

21. The semiconductor package of claim 20 wherein said inner chamber comprises a plurality of evaporator regions corresponding to said plurality of recesses and a condenser region corresponding to said plurality of channels.

* * * * *